United States Patent [11] 3,599,057

[72] Inventor William F. Lootens
Skaneateles, N.Y.
[21] Appl. No. 796,136
[22] Filed Feb. 3, 1969
[45] Patented Aug. 10, 1971
[73] Assignee General Electric Company

[54] SEMICONDUCTOR DEVICE WITH A RESILIENT LEAD CONSTRUCTION
4 Claims, 4 Drawing Figs.

[52] U.S. Cl. .......... 317/234, 317/235, 174/54
[51] Int. Cl. .......... H01l 5/00, H01l 11/00
[50] Field of Search .......... 317/234, 4, 5.4, 6

[56] References Cited
UNITED STATES PATENTS

| | | | |
|---|---|---|---|
| 3,192,454 | 6/1965 | Rosenheinrich et al. | 317/234 |
| 3,296,506 | 1/1967 | Steinmetz et al. | 317/234 |
| 3,489,957 | 1/1970 | Warga | 317/234 |
| 3,437,887 | 4/1969 | Nowalk et al. | 317/234 |
| 3,463,976 | 8/1969 | Steinmetz et al. | 317/235 |
| 3,441,814 | 4/1969 | Steinmetz et al. | 317/234 |
| 3,492,545 | 1/1970 | Meyerhoff | 317/234 |
| 3,450,962 | 6/1969 | Ferree et al. | 317/234 |

FOREIGN PATENTS

| | | | |
|---|---|---|---|
| 1,234,326 | 2/1967 | Germany | 317/235 X |

*Primary Examiner*—John W. Huckert
*Assistant Examiner*—B. Estrin
*Attorneys*—Robert J. Mooney, Carl O. Thomas, Frank L. Neuhauser and Oscar B. Waddell

ABSTRACT: A silicon-controlled rectifier is disclosed having a gate lead formed of a resilient spring. The deflection of the spring assures a good electrical connection of the lead both to the control surface of a semiconductive element and the housing terminal which is independent of other electrical connections to the semiconductor element. One major current carrying terminal is slotted to receive the spring in insulative relation, and the spring also centralizes a loose backup plate.

INVENTOR:
WILLIAM F. LOOTENS,
BY Carl O. Thomas
HIS ATTORNEY.

SEMICONDUCTOR DEVICE WITH A RESILIENT LEAD CONSTRUCTION

My invention relates to a simple and efficient control lead arrangement for a semiconductor device.

In constructing semiconductor devices, such as controlled rectifiers and transistors, having at least one low current control lead it has been conventional practice merely to solder a lead wire first to the control zone of the semiconductive element and then to the surface of the control terminal extending to the interior of the device housing. while such an arrangement is very simple and easily assembled, While has not exhibited a high degree of reliability. It has been observed in usage that the solder connections to the housing and semiconductive element are subject to failure, probably due to fatigue resulting from either thermal cycling of the device or mechanical shocks received in handling or use.

In order to eliminate the necessity of soldering directly to the control zone of a semiconductive element elaborate arrangements have been devised for spring biasing a control lead into compressive contact with a control zone. These arrangements have typically required helical springs and special spring housings to be incorporated into a semiconductor device, thereby significantly adding to the size, cost, and complexity of the device.

More recently it has been proposed to utilize one of the major current-carrying terminals to compress a control lead against the control zone of a semiconductive element. In this arrangement the control lead remains soldered to the control terminal adjacent the interior of the housing, thereby retaining a possible fatigue failure point. At the same time the requirement is introduced of carefully matching the relative dimensions of the control lead and the associated major current-carrying terminal portion. The reason is that the major current-carrying terminal portion is urged against the semiconductive element with a force of several thousand pounds, but the force is distributed over a substantial current-carrying contact area so that at any one area on the semiconductive element surface no excessive stress is built up on the semiconductive element which would tend to induce fracture of this element. Unless close tolerances are set in the manufacture of the terminals and control leads, however, some of the control leads will exhibit and extra increment of length relative to the terminals that will cause an excessive amount of the compressive force to be transmitted to the control lead rather than to the major current-carrying surface area of the semiconductive element. Since the control lead is provided with approximately a point contact with the control zone, it is apparent that the stress transmitted to the semiconductive element at its point of contact with the control lead will be extremely high, thereby introducing the possibility of fracture of the semiconductive element either on assembly or in use. At the same time, when the length of the control lead is deficient by an increment with respect to the terminal portion the control lead may not contact the control zone with sufficient compressive force to maintain a reliable contact.

It is an object of my invention to provide a semiconductor device having a simple and reliable control lead which does not require soldering or close tolerances of elements.

This and other objects of my invention are accomplished in one aspect by providing a semiconductor device comprised of semiconductive means capable of conducting a large current between first and second junction separated surface areas in response to a low input current between a control zone and one of the surface areas. A first means cooperates with the first surface area to provide a low impedance current path therefrom to an exterior surface of the device, and a second means cooperates with the second surface area to provide a low impedance current path therefrom to a second exterior surface of the device. Insulative means cooperate with the first and second means to form a housing surrounding the semiconductive means. A control terminal is sealingly fitted to the housing and is electrically insulated from the first and second means. The control terminal has a recess therein. A resilient spring is provided with a first extremity slidably fitted into the recess and resiliently biased into low impedance electrical interconnection therewith. A second extremity of the spring is resiliently urged into low impedance contact with the control zone.

My invention may be better understood by reference to the following detailed description considered in conjunction with the drawings, in which.

Figure 1:
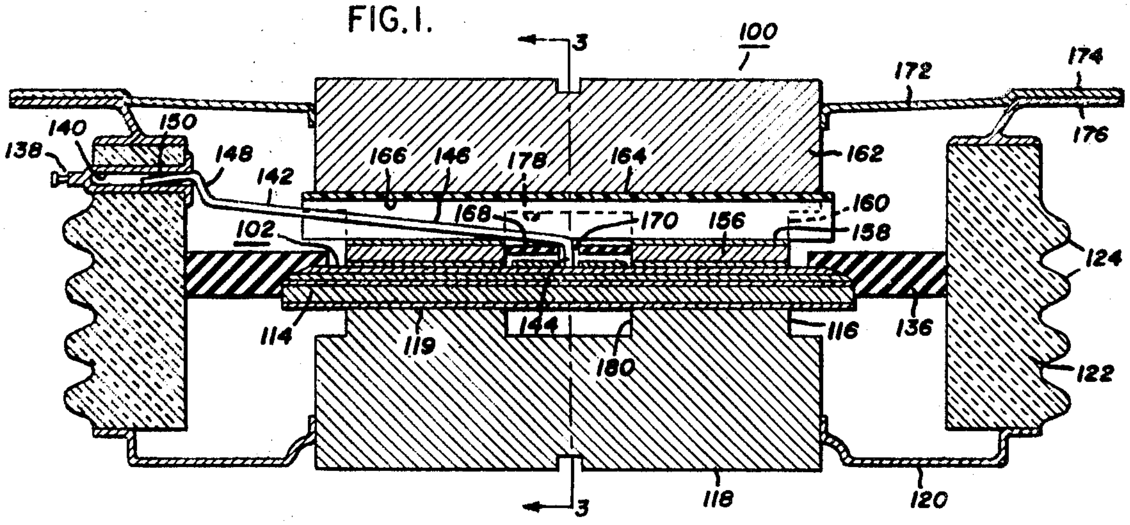
FIG. 1 is vertical section of semiconductor device according to my invention.
Figure 2:
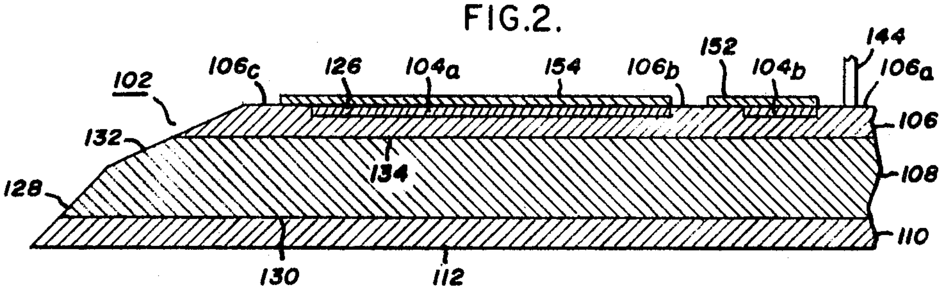
FIG. 2 is a vertical section of the semiconductive element mounted within the semiconductor device.
Figure 4:
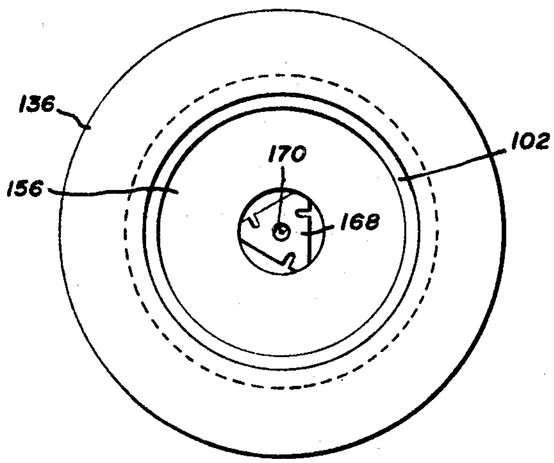
FIG. 4 is a plan view of a subassembly.
Figure 3:
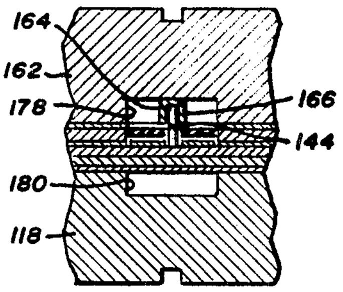
FIG. 3 is a sectional detail taken along section line 3–3 in FIG. 1.

In FIG. 1 a semiconductor device 100 is shown in vertical section having a semiconductive element 102 mounted therein, shown separately in FIG. 2. In the form shown the semiconductive element is comprised of a first layer divided into a main portion **104*a* and a pilot portion 104*b*. A second layer 106 of opposite conductivity type includes a gate portion or control zone 106*a* which is located centrally of the pilot portion of the first layer. The control zone is separated from the main portion of the first layer by the pilot portion of the first layer. The second layer is additionally provided with a spacing portion 106*b* which separates the pilot and main portions of the first layer. Finally, the second layer includes a remote portion 106*c* which is separated from the pilot portion of the first layer by the main portion thereof. A third layer 108 is separated from the first layer by the second layer and is of like conductivity type as said first layer and of opposite conductivity type from said second layer. A fourth layer 110** is of like conductivity type as the second layer and of opposite conductivity type from the first and third layers. It is then apparent that the semiconductive element is comprised of two P-type conductivity layers and two N-type conductivity layers interleaved to form a thyristor or controlled rectifier element.

As shown a first major surface 112 of the semiconductive element adjacent fourth layer 110 is positioned adjacent a backup plate 114 having a relatively low thermal coefficient of expansion as compared to the adjacent pedestal portion 116 of the housing terminal member 118. Typically the housing terminal member is formed of a metal, such as brass, copper, aluminum, etc., having a high degree of electrical and thermal conductivity, but exhibiting a thermal coefficient of expansion very much higher than the thermal coefficient of expansion of the semiconductive element metal, typically silicon. Since the semiconductor device may be called upon to withstand thermal excursions as great as from −60° to 200° C. either in use or storage, it is undesirable to place the terminal member in direct contact with the semiconductive element. This would result in large thermally induced stresses being transmitted to the semiconductive element. To reduce thermally induced stresses the backup plate 114 is formed of an electrically conductive metal having a thermal coefficient of expansion below that of the housing terminal member. It is preferred to utilize a metal such as tungsten, molybdenum, or tantalum, which exhibits a thermal coefficient of expansion of less than $1\times10^{1}10^{5}$ in/in per °C., most preferably less than $0.5 \times 10^{15}$ in/in per °C. A thin layer 119 of a malleable metal, such as gold or sliver, is interposed between the backup plate 114 and the terminal member 118.

The terminal member 118 is welded or otherwise sealingly secured to an annular flange 120. The flange is in turn sealingly secured to an annular electrically insulative ring 122. The ring is preferably formed of a material having a high dielectric strength, such as glass or ceramic materials. The exterior surface of the ring is provided with four (as shown) annular protrusions 124 to increase the exterior surface distance between the opposite extremities of the ring.

The semiconductive element is provided with a second major surface 126 formed by the first and second layers. The second major surface is parallel to the first major surface. To reduce the likelihood of surface breakdown of the semiconductive element upon reverse biasing, the parallel major surfaces are joined by a first beveled peripheral surface 128 which intersects the anode emitter junction 130 between the third and fourth layers at an acute angle. A second beveled peripheral surface 132 intersects the cathode base junction 134 formed between the second and third layers at an acute angle. As is well understood by those skilled in the art the acute angles at which the first and second beveled peripheral surfaces intersect the adjacent junctions may be chosen to modify the electrical field gradient along the surfaces to increase the peak blocking voltages that may be withstood by the device without damage.

An annular member 136 extends between the interior surface of the ring member and the peripheral surfaces of the semiconductive element and the backup plate 114. The annular member cooperates with the interior surface of the ring to hold the semiconductive element and backup plate 114 in centered relation with the pedestal portion 116 of the housing terminal member 118. Since the annular member 136 is preferably formed of a resilient material, it is unnecessary to provide a clearance between the ring and annular member to allow the fitting or for differentials in thermal expansion. Further, the resiliency of the annular member allows very wide tolerances to be maintained in forming the interior surface of the ring, thereby allowing its cost to be reduced. The resiliency of the annular member also protects the semiconductive member from laterally transmitted mechanical shocks that might otherwise fracture the semiconductive element. The annular member if formed of a junction passivant material having a relatively high insulative resistance and dielectric strength and is substantially impervious to junction contaminants. I prefer to utilize passivants having a dielectric strength of at least $10^{10}$ volts/mil and an insulative resistance of at least 100 ohm-cm. A number of commercially available forms of silicone rubber are noted to meet these electrical criteria. In the form shown the annular member is formed by molding silicone rubber to the periphery of semiconductive element and backup plate 114.

The ring is provided with a control terminal 138 sealingly fitted therein. The control terminal is provided with a closed end recess 140 opening toward the interior of the ring. A resilient spring 142 provides a low impedance electrical interconnection between the control zone and the control terminal. The spring is provided with a first portion 144 that extends upwardly from the control zone and bears against the control zone at its lower extremity. A second portion 146 extends laterally from the first portion toward the control terminal. A third portion 148 extends upwardly from the second portion to the height of the recess and a fourth portion 150 is fitted into the recess. In the form shown the first, second, third, and fourth portions of the spring are formed merely by bending a continuous resilient metal strip. While the fourth portion of the spring is shown as nearly parallel to the second portion, when the spring is removed from the recess, the fourth portion forms an acute angle with the second portion, typically 15° to 45°. In positioning the spring the lower surface of the recess bears upwardly on the outer extremity of the spring while the upper surface of the recess bears downwardly on the inner portion of the fourth portion. In mounting the spring the first, second, and third portions are deflected with respect to the fourth portion so that the lower extremity of the first portion is continuously urged downwardly onto the surface of the control zone to provide a low impedance interconnection. It is to be noted that the amount of compression with which the spring contacts the control zone is determined by the spring. It is unnecessary to size or locate the control terminal or the terminal member 118 within close tolerances, since the lower extremity of the first portion of the spring can be raised and lowered within relatively wide tolerances without greatly varying the amount of compression applied to the semiconductive element. This is attributable to the deflection of the spring, primarily in the relatively elongated second portion.

The annular backup plate is provided with a thin malleable layer 158 adjacent its upper surface that cooperates with the pedestal portion 160 of the housing terminal member 162. The malleable layer 158 is formed similarly as and performs like functions as the malleable layer 119. The housing terminal members 118 and 162 may be identically formed, except that the housing terminal member 162 is provided with a central slot 164 within which an insulative lining 166 is located. The slot allows the spring 142 access to the control zone of the semiconductive element while the lining prevents shorting of the spring to the housing terminal member 162. It is to be noted that the slot has a depth greater then the height of the second portion of the spring above the semiconductive element when in the mounted position shown so that a vertical clearance is present between the terminal member 162 and the spring. Thus, the compression applied to the spring is entirely independent of the compression applied to the terminal member 162. The slot also prevents the spring from twisting laterally out of position. Since the fourth portion of the spring is free to rotate in the recess of the control terminal and the first portion is stood on its lower extremity to form a point contact, it is appreciated that in jarring or vibrating the device the spring might tend to rotate laterally unless restrained. To ensure that the spring cannot rotate laterally out of position, the length of the first portion of the spring in a direction measured normal to the second portion is preferably greater than the width of the slot. Usually it is desirable to size the slot so that the spring is held at all times in the upright position shown in FIG. 1. It is appreciated that since the spring merely extends from one side of the device to the center, it is not necessary that the slot and/or lines traverse the entire width of the housing terminal member 162 as shown.

A pilot ring 152 is spaced laterally from the lower end of the spring 142 with its inner edge coextensive with the pilot portion of the first layer and its outer edge overlying the spacing portion of the second layer, but spaced from the main portion of the first layer. The pilot ring may be formed of any electrically conductive material, such as any conventional contact metal layer or combination of metal layers.

A thin protective layer 154 overlies the main portion of the first layer with its outer edge also extending over the remote portion of the second layer. The function of the protective layer is to minimize any resistance or voltage drop over the first and second layer portions which it overlies. Semiconductive elements formed of silicon, for example, are known to form thin oxide coatings when exposed to the atmosphere. Where the cathode emitter base junction between the main portion of the first layer and the second layer is formed by diffusion silicon is exposed over the upper surface of the first layer. I adhere the thin protective layer before the surface has had an opportunity to build up the normal oxide coating. The protective layer may be formed of any of a wide variety of metals known to be capable of forming adherent layers to semiconductive elements, such as aluminum, gold, silver, vanadium, platinum, nickel, tungsten, molybdenum, tantalum, and multilayer combinations. By maintaining the protective layer thin, in the order of from 100 A. to 1 mil in thickness, the amount of thermal stress that may be transmitted to the semiconductive element by the protective layer remains negligibly small. The pilot ring 152 is preferably laid down at the same time and in the same manner as the protective layer 154.

Annular backup plate 156 overlies the protective layer. The annular backup plate is chosen by applying the same electrical conduction and thermal expansion considerations discussed with reference to backup plate 114 and is usually conveniently formed of the same metal as backup plate 114. Since tungsten and molybdenum, the two most common backup plate metals, are quite rigid, it is preferred to utilize a relatively malleable metal to form the protective layer. In such circumstance the protective layer improves the electrical conduction between the backup plate and semiconductive element by reducing oxidation and also by deforming on compression to conform more closely to the adjacent surface of the backup plate.

An electrically insulative centralizer 168 cooperates with the inner periphery of the annular backup plate to hold it in alignment. The centralizer contains a central aperture 170 which receives the extremity of the first portion 144 of the spring. Thus, the spring indexes the annular backup plate. The housing terminal means 162 is sealingly united to flange 172 provided with a peripheral rim 174. A cooperating rimmed flange 176 is sealingly joined to the insulative ring.

In assembling the semiconductor device, the terminal member 118, flange 120, ring 122, gate terminal 138, and rimmed flange 176 are initially united to form a lower housing portion. The annular member 136 is molded around the backup plate 114 with its thin malleable layer 119 attached and the semiconductive element 102 with its protective layer and pilot ring attached. The resulting subassembly is then introduced into the lower housing portion and set on the pedestal portion 116 of housing terminal member 118. The insulative centralizer 168 is then fitted to the inner edge of the annular backup plate 156, which is then placed over the protective layer. The fourth portion of the resilient spring 142 is inserted into the recess 140 at approximately a 90° angle to the position shown and rotated with its first portion 144 being forcibly deflected upwardly so that it enters the aperture 170 in the centralizer. The terminal member 162 is attached to the flange 172 to form the upper housing portion. The upper housing portion with the lining 166 in the slot 164 of the terminal member is then positioned so that the pedestal portion 160 overlies the annular backup plate. The flange 172 is located so that the rim portion of 174 and rim flange 176 have a slight clearance, usually less than 10 mils, when the pedestal portion 160 and the annular backup plate come into engagement. The rim portion and rim flange are then compressed into engagement and cold-welded or otherwise suitably joined so that the housing is sealed. As is well understood in the art an external fixture is utilized to make electrically and thermally conductive engagement with the exterior surfaces of the terminal members and to compress the terminal members inwardly so that any clearance between internal elements is eliminated.

It is to be noted that when the device is placed in a conventional clamping fixture the pedestal portions 116 and 160 of the terminal members exert compressive forces opposite in direction over vertically aligned areas of similar size and configuration. The upper pedestal portion is recessed at 178 to avoid the possibility of contact with the pilot ring while the lower pedestal portion is recessed at 180 over an identical area. Aligning the upper and lower pedestals forestalls any possibility of a bending mement being transmitted to the semiconductive element 102 which could result in undue stress or fracture of the element.

It is not necessary to solder or otherwise bond the annular backup plate to either the protective layer or the adjacent pedestal in order to achieve a low impedance contact between the terminal member and the semiconductive element, although this may be done, if desired. In the preferred form of the device the backup plate is assembled into the device "loose," that is, free of direct bonding to either the protective layer or the associated pedestal portion. With only a compressive association with the protective layer and the pedestal portion a low impedance interconnection is achieved through the backup plate between the terminal member and the semiconductive element. This arrangement is advantageous for a variety of reasons. For example, the step of soldering the backup plate to the semiconductive element and/or pedestal portion is eliminated with a corresponding savings in both time and materials. The possibility of damaging the semiconductive element by excessive heating during soldering is eliminated and the possibility of device failure by fatigue of the solder joint during thermal cycling is eliminated. The backup plate 114 may be loosely associated with the first major surface 112 of the semiconductive element similarly as the annular backup plate is associated with the second major surface 126, or the backup plate 114 may be attached by soldering, as is conventional practice.

The semiconductor device 100 is a gate-controlled rectifier or thyristor having a pilot turn on feature that allows the device to withstand high *di/dt* and *dv/dt* operation modes. A description of the electrical operating characteristics of such a semiconductor device are set out by Moyson in application, Ser. No. 741,675, filed July 1, 1968, titled Monolithic Compound Thyristor, the disclosure of which is here incorporated by reference. A detailed description of the general electrical switching characteristics of the device is therefore considered unnecessary in this application. It is to be noted, however, that when the device is in its conducting mode a low impedance high current path is provided between the terminal members. Current in flowing from the anode terminal member 118 to the cathode terminal member 158 first flows from the pedestal portion 116 to the backup plate 114. The thin malleable layer 119, typically a gold or sliver layer, is deformed by compression so that it provides intimate electrical interconnection between the pedestal portion and the backup plate, despite any slight irregularities that may be present. To obtain a near comparable low impedance contact between the backup plate 114 and pedestal portion with the malleable layer would require carefully controlled machining of the backup plate and pedestal portions. Current flowing from the backup plate 114 to the semiconductive element and from the semiconductive element to the backup plate 156 is achieved with a minimal forward voltage drop by reason of providing the thin protective layer adhered to either or both major surfaces to minimize surface impedances, such as may be produced by oxidation, for example. The thin protective layer allows the backup plates to be merely compressed against rather than soldered to the semiconductive element even though the junctions adjacent the surfaces of the semiconductive element are formed by diffusion. The current path from the backup plate 156 through the malleable layer 158 to the pedestal portion 160 of the terminal member 162 also provides a low contact impedance. The result is that the semiconductive device exhibits a low forward voltage drop when present in an electrical circuit in the conducting mode. This not only improves the efficiency of the device, but also increases the power-handling capabilities, since the internal resistance of the device is maintained at a very low level.

While my invention has been disclosed with specific reference to a gate-controlled rectifier or thyristor, it is apparent that it is capable of substantially broader application. For example, instead of using a gate turn on thyristor element having an integrated monolithic pilot as shown, the pilot turn on feature could be eliminated merely by eliminating pilot portion **104*b* of the first layer and the pilot ring. Without a pilot turn on feature the annular backup plate could be extended inwardly much closer to the gate contact so as to increase the cathode area. With a small spacing between the backup plate 156 and the spring 142 an insulative sleeve on the spring could be substituted for centralizer 170. It is, of course, recognized that any conventional gate-operated thyristor element could be substituted by semiconductive element 102**. Also, instead of using the spring as a gate lead for a thyristor, the gate lead could be used as a base lead for a transistor if such an element were substituted for the thyristor element. Instead of using an insulative liner the spring may be provided with an insulative coating mediate its ends. While the spring has been shown formed of a single strip extending between its extremities, it is appreciated that the spring could easily be formed of a single strip folded back on itself so that the ends of the strip could be both located adjacent one extremity or even between the extremities. It is also contemplated that multiple-control terminals and/or springs may be mounted in a single device.

Since it is considered that these and numerous other variations of my invention would readily occur to those skilled in the art having considered my disclosure, it is intended that the scope of my invention be determined by reference to the following claims.

What I claim as new and desire to secure by Letters Patent of the United States is:

1. A semiconductor device comprised of semiconductive means capable of conducting a large current between first and second junction separated surface areas in response to a low input current between a control zone and one of said surface areas, first terminal means including a pedestal portion having a lateral slot therein cooperating with said first surface area to provide a low impedance current path therefrom to an exterior surface of said device in response to an externally applied compressive force, said pedestal portion being laterally separated from said control zone by the slot therein, second terminal means cooperating with said second surface area to provide a low impedance current path therefrom to a second exterior surface of said device in response to the externally applied compressive force, unitary annular insulative means cooperating with said first and second terminal means to form a housing surrounding said semiconductive means, a control terminal sealingly extending laterally through said unitary annular insulative means in spaced relation to said first and second terminal means and having a recess therein, a unitary resilient spring control lead provided with a first extremity slidably fitted into the recess and resiliently biased into low impedance electrical interconnection therewith, a second extremity resiliently urged into low impedance contact with said control zone, and a midportion located within the slot and spaced from said first terminal means so that said unitary resilient spring control lead determines the contact pressure which it transmits to said control zone independently of the compressive force externally applied to said first and second zones through said first and second terminal means, and means insulating said unitary spring control lead from said first terminal means.

2. A semiconductor device according to claim 1 in which said spring is provided with a first portion adjacent said second extremity extending away from said control zone and a second portion extending laterally toward said control terminal through the slot, and said first portion is deflected laterally from said second portion in a direction measured normal to said second portion a distance exceeding the width of the slot.

3. A semiconductor device according to claim 1 in which said spring is provided with a first portion adjacent said second extremity extending away from said control zone and a second portion extending laterally through said slot, the slot extending above the semiconductive means to a height greater than the height of the second spring portion above the semiconductive means, whereby a clearance is provided between said second spring portion and said first terminal means within the slot measured in a direction normal to said one surface of said semiconductive means.

4. A semiconductor device according to claim 1 in which said control zone is located centrally of said first surface area, said first terminal means includes an annular electrically conductive loose disc, and an insulative centralizer cooperates with said spring and said disc to align said disc with said first surface.